United States Patent
Noguchi et al.

(10) Patent No.: US 8,570,766 B2
(45) Date of Patent: Oct. 29, 2013

(54) SHIELD CASE AND COMMUNICATION DEVICE

(75) Inventors: Kazuya Noguchi, Kawasaki (JP);
Hiromi Maeda, Kawasaki (JP);
Toshimitsu Kobayashi, Kawasaki (JP);
Atsushi Kaneko, Kawasaki (JP);
Yoshihiro Waki, Kawasaki (JP); Masaki Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 184 days.

(21) Appl. No.: 12/956,603

(22) Filed: Nov. 30, 2010

(65) Prior Publication Data
US 2011/0128715 A1 Jun. 2, 2011

(30) Foreign Application Priority Data
Dec. 1, 2009 (JP) .................................. 2009-273584

(51) Int. Cl.
*H05K 9/00* (2006.01)
*H05K 5/06* (2006.01)

(52) U.S. Cl.
CPC ..................................... *H05K 5/061* (2013.01)
USPC ........................... 361/816; 361/800; 361/641

(58) Field of Classification Search
CPC .................................................... H05K 5/061
USPC ......... 361/816, 641, 819, 820, 713, 752, 753, 361/757, 800
See application file for complete search history.

(56) References Cited

U.S. PATENT DOCUMENTS

| | | | | | |
|---|---|---|---|---|---|
| 4,713,633 | A | * | 12/1987 | Saito et al. ..................... | 333/222 |
| 4,724,281 | A | * | 2/1988 | Nix et al. ......................... | 174/53 |
| 5,417,587 | A | | 5/1995 | Katsuda et al. | |
| 5,473,111 | A | * | 12/1995 | Hattori et al. ................. | 174/363 |
| 5,539,148 | A | * | 7/1996 | Konishi et al. ................ | 174/391 |
| 5,763,824 | A | * | 6/1998 | King et al. ..................... | 174/374 |
| 5,818,699 | A | * | 10/1998 | Fukuoka ....................... | 361/760 |
| 6,809,254 | B2 | * | 10/2004 | Clement et al. ............... | 174/389 |

(Continued)

FOREIGN PATENT DOCUMENTS

| | | |
|---|---|---|
| JP | 57-188385 | 5/1981 |
| JP | 6-58560 U | 8/1994 |

(Continued)

OTHER PUBLICATIONS

Japanese Office Action mailed Aug. 13, 2013 for corresponding Japanese Application No. 2009-273584, with English-language translation.

*Primary Examiner* — Yuriy Semenenko
(74) *Attorney, Agent, or Firm* — Fujitsu Patent Center

(57) ABSTRACT

A shield case includes a first shield member and a second shield member coupled to the first shield member to form the shield case. A concave portion is capable of accommodating a sealing member for sealing inner space of the shield case by contacting the first shield member and the second shield member, and is formed on the second shield member. On each of the first shield member and the second shield member, a paint film portion is formed on an area of the shield case external to the concave portion. On the first shield member or the second shield member or combination thereof, a convex portion is formed on the area of the shield case on the inner space side and internal to the concave portion. The surfaces of the first shield member and the second shield member contact each other at the convex portion.

16 Claims, 12 Drawing Sheets

(56) References Cited

U.S. PATENT DOCUMENTS

| | | | |
|---|---|---|---|
| 6,822,161 B2 * | 11/2004 | Komatsu et al. | 174/367 |
| 2002/0015295 A1 * | 2/2002 | Takaya | 361/816 |
| 2003/0202326 A1 * | 10/2003 | Toh | 361/690 |
| 2010/0046190 A1 * | 2/2010 | Tsunemasu | 361/816 |
| 2010/0134949 A1 * | 6/2010 | Choi | 361/301.2 |

FOREIGN PATENT DOCUMENTS

| | | |
|---|---|---|
| JP | 10-172646 A | 6/1998 |
| JP | 2001-291985 | 10/2001 |
| JP | 2003-179377 | 6/2003 |
| JP | 2006-203150 | 8/2006 |

* cited by examiner

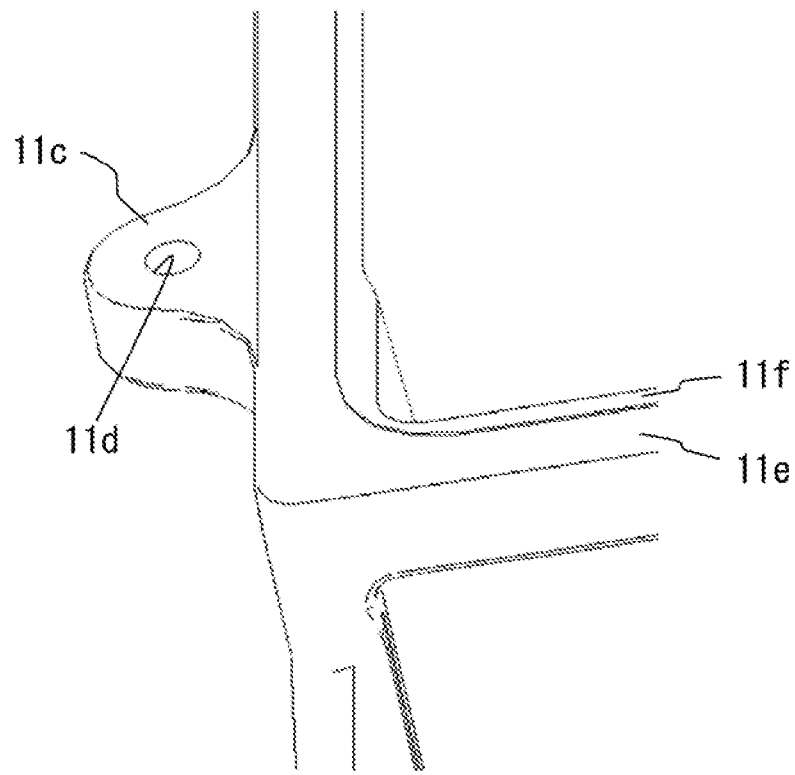
F I G. 4

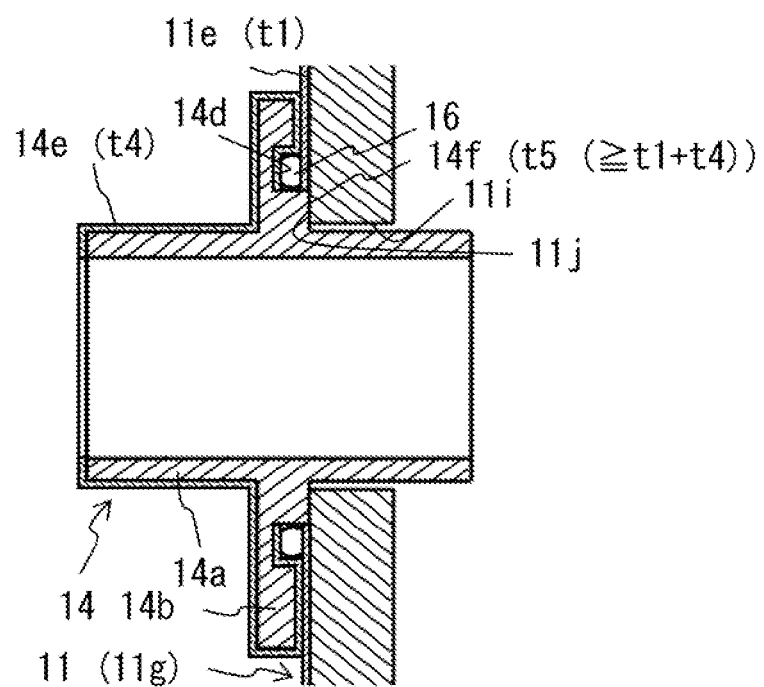
F I G. 8

SHIELD CASE AND COMMUNICATION DEVICE

CROSS-REFERENCE TO RELATED APPLICATIONS

This application is based upon and claims the benefit of priority of the prior Japanese Patent Application No. 2009-273584 filed on Dec. 1, 2009, the entire contents of which are incorporated herein by reference.

FIELD

The embodiments discussed herein are related to a shield case which includes an electromagnetic shield structure, and a communication device which includes a shield case and a substrate provided with an electronic circuit and arranged in the inner space of the shield case.

BACKGROUND

Especially, a device provided outdoors has conventionally been provided with an electromagnetic shield structure to prevent the discharge etc. of an electromagnetic interference wave to neighboring electronic equipment.

The device has attained an acceptable function by connecting the body of a shield case to its cover by a painting process and a waterproofing packing to guarantee durability, airtightness, and watertightness.

FIG. 9 is a sectional view of a packing 83 between a body unit 81 and a cover unit 82, and painted portions 81a and 82a.

The body unit 81 and the cover unit 82 are a part of the shield case separately accommodating a substrate etc. having an electronic circuit. The body unit 81 and the cover unit 82 are provided respectively with the painted portions 81a and 82a.

The cover unit 82 is fixed to the body unit 81 below in FIG. 9 using, for example, a bolt not illustrated in FIG. 9. Between the cover unit 82 and the body unit 81, a concave portion 82b for packing is formed on the contact surface of the cover unit 82. The concave portion 82b for packing accommodates an elastic packing 83.

FIG. 10 is a sectional view of a packing 93 and painted portions 91a and 92a between a connector unit 91 and a body unit 92 of the shield case.

The connector unit 91 includes a cylindrical unit 91b accommodating a connector housing etc. not illustrated in FIG. 19 and a flange unit 91c extending from the cylindrical unit 91b.

The painted portion 91a is formed on the outside surface portion of the connector unit 91. The painted portion 92a is formed on the outside surface portion of the body unit 92 and faces the flange unit 91c of the connector unit 91.

The connector unit 91 is fixed to the body unit 92 with, for example, a bold not illustrated in FIG. 10 in the right direction in FIG. 10. On the contact surface between the flange unit 91c and the body unit 92, a concave portion 91d for packing is arranged. The concave portion 91d for packing accommodates the elastic packing 93.

Proposed as a shield connector directly attached to vehicle equipment is a shield connector having a metal shell provided for a connector housing and a seal ring provided for the connector attachment hole of the casing of an on-board electric equipment.

Also proposed is a waterproof connector provided with an O ring on a male connector and a packing on a female connector.

Patent Document 1: Japanese Laid-open Utility Model Publication No. 06-58560

Patent Document 2: Japanese Laid-open Patent Publication No. 10-172646

SUMMARY

According to an aspect of the invention, a shield case includes a first shield member and a second shield member coupled to the first shield member to form the shield case. a concave portion is capable of accommodating a sealing member for sealing inner space of the shield case by contacting the first shield member and the second shield member, and is formed on the first shield member. On each of the first shield member and the second shield member, a paint film portion is formed on an area of the shield case external to the concave portion. On the first shield member or the second shield member or combination thereof, a convex portion is formed on the area of the shield case on the inner space side and internal to the concave portion. The surfaces of the first shield member and the second shield member contact each other at the convex portion.

According to an aspect of the invention, a communication device includes a first shield member, a second shield member coupled to the first shield member to form the shield case, and a substrate provided with an electronic circuit and arranged in the inner space of the shield case. A concave portion is capable of accommodating a sealing member for sealing inner space of the shield case by contacting the first shield member and the second shield member, and is formed on the first shield member. On each of the first shield member and the second shield member, a paint film portion is formed on an area of the shield case external to the concave portion. On the first shield member or the second shield member or combination thereof, a convex portion is formed on the area of the shield case on the inner space side and internal to the concave portion. The surfaces of the first shield member and the second shield member contact each other at the convex portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is an expanded view of the part A in FIG. 1;

FIG. 8 is a sectional view of the convex portion etc. of the shield case;

DESCRIPTION OF EMBODIMENTS

Figure 9:
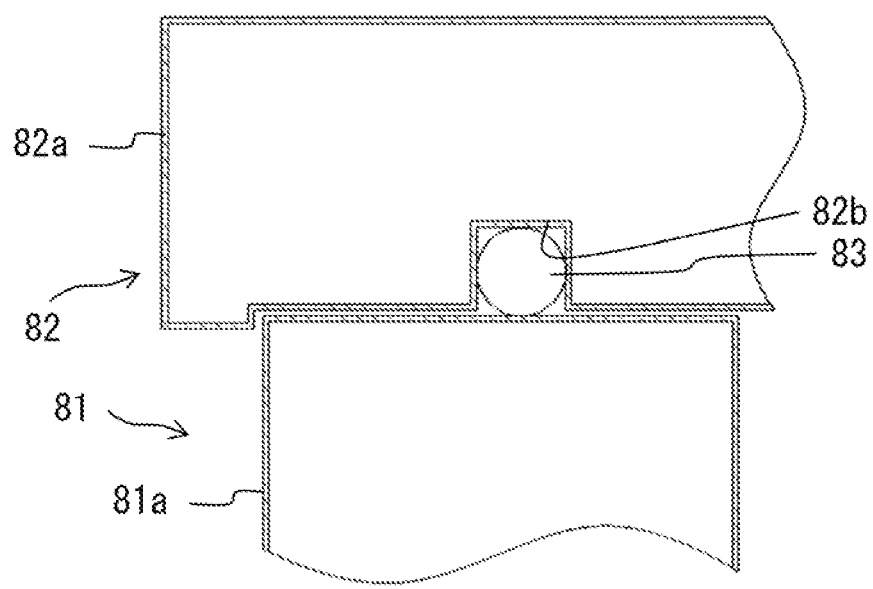
FIG. 9 is a sectional view of the packing and the painted portion between the body unit and the cover unit of the shield case.
Figure 10:
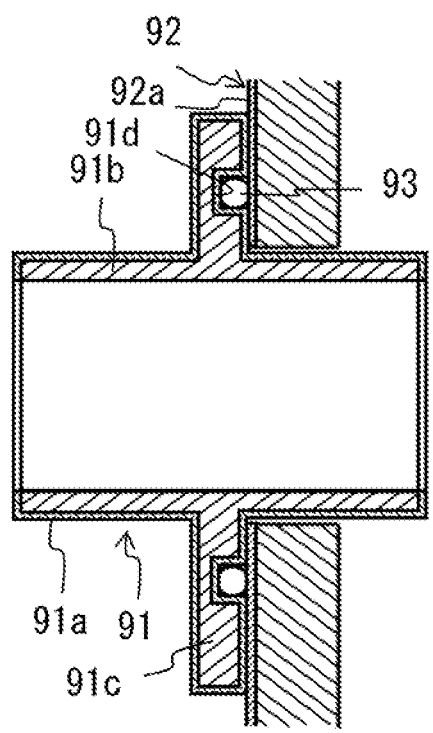
FIG. 10 is a sectional view of the packing and the painted portion between the connector portion and the shield case.

If the durability, the airtightness, and the watertightness of a device can be guaranteed by the packing and the painted portion illustrated in FIGS. 9 and 10, then the sealing members of the shield case such as the body unit, the cover unit, the connector unit, etc. are arranged facing each other with the packing and the painted portions interposed. Therefore, they can be insulated from one another by a paint film portion.

Therefore, although the electromagnetic shield is to be guaranteed by electrically connecting a plurality of shield members by cable, electromagnetic interference waves are discharged from insulating portions, the electromagnetic shielding characteristics of a device become insufficient.

Described below is the shield case and the communication device according to the embodiments of the present invention.

<First Embodiment>

Figure 1:
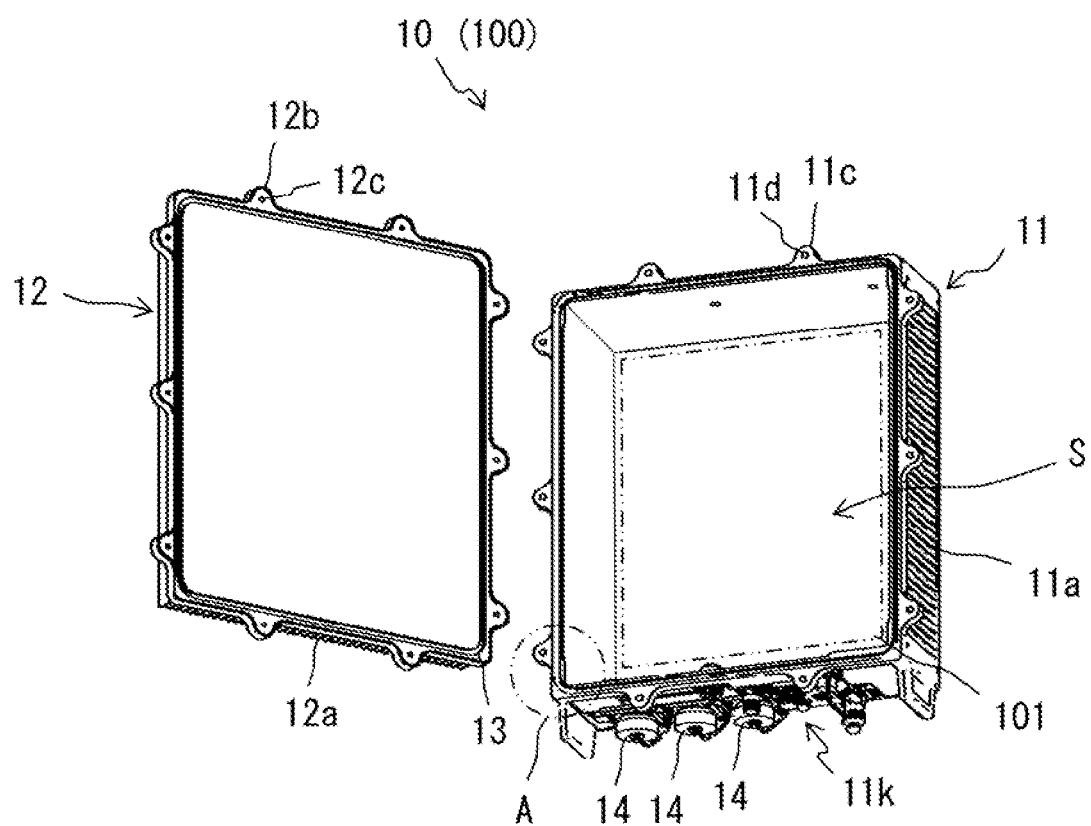
FIG. 1 is an exploded perspective view of the outline of the shield case when the cover unit is removed.
Figure 2A:
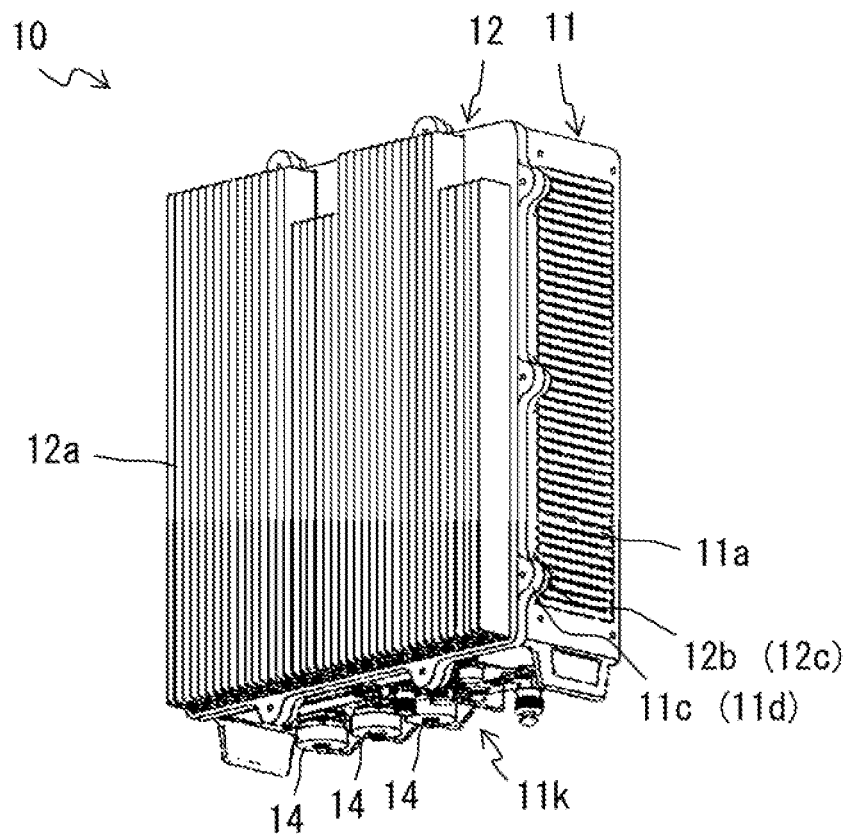
FIG. 2A is a perspective view of a shield case.
Figure 2B:
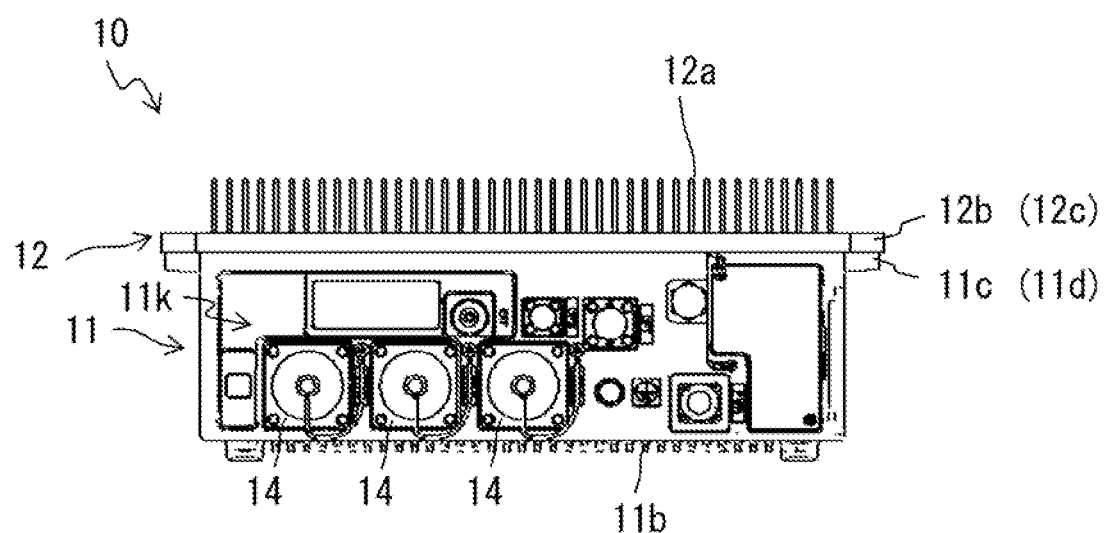
FIG. 2B is a front view of the shield case.
Figure 2C:
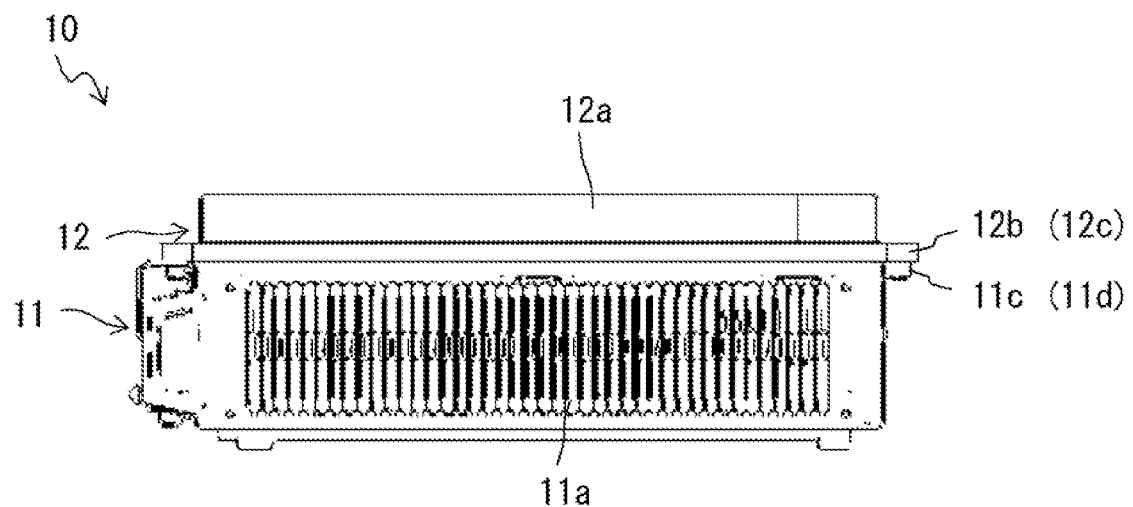
FIG. 2C is a right side view of the shield case.

FIG. 1 is an exploded perspective view of the outline of the shield case 10 when the cover unit 12 is removed;

FIG. 2A is a perspective view of a shield case 10. FIG. 2B is a front view of the shield case 10. FIG. 2C is a right side view of the shield case 10.

Figure 3:
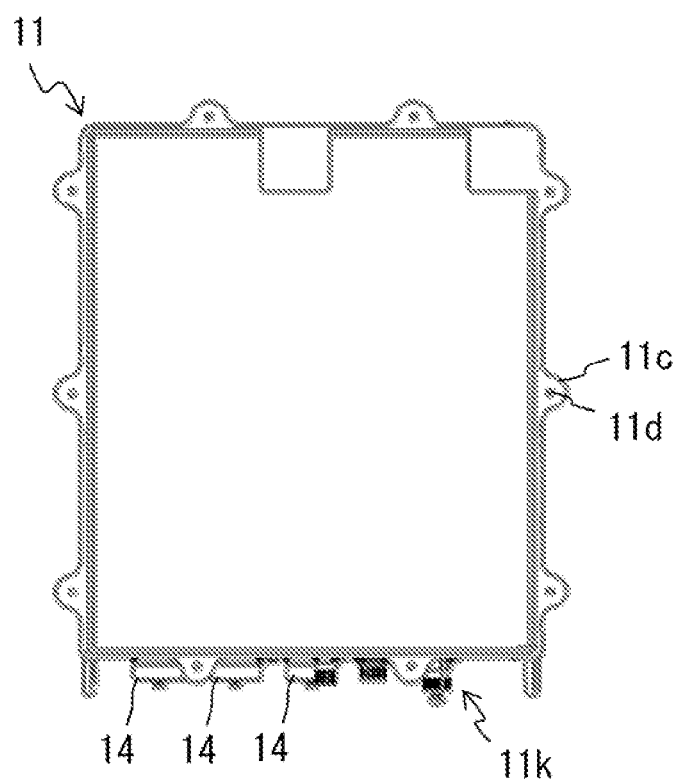
FIG. 3 is a plan view of the body unit of the shield case.

FIG. 3 is a plan view of the body unit 11 of the shield case 10.

FIG. 4 is an expanded view of the part A in FIG. 1.

Figure 5:
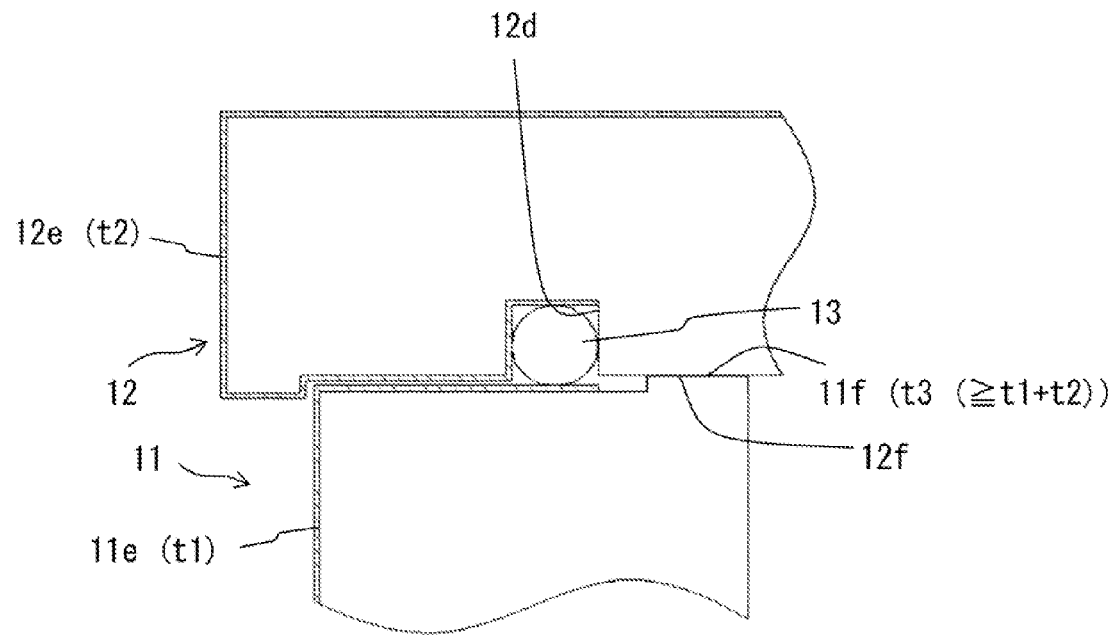
FIG. 5 is a sectional view of the convex portion etc. of the shield case.

FIG. 5 is a sectional view of the convex portion 11*f* etc. of the shield case 10.

As illustrated in FIG. 1, a shield case 10 includes a body unit 11 and a cover unit 12. The body unit 11 accommodates a substrate 101 (the rough position is indicated by a chain double-dashed line in FIG. 1) etc. provided with an electronic circuit. The shield case 10 accommodating the substrate 101 etc. and appropriately provided with wiring functions as a communication device 100. The body unit 11 and the cover unit 12 are examples of a electroconductive first shield member of metal etc., and a electroconductive second shield member of metal etc. and coupled to the first shield member to form the shield case 10.

Heat radiation fins 11*a* and 11*b* are formed on the right side and the bottom illustrated in FIG. 2C. A heat radiation fin 12*a* is also formed on the top surface (refer to FIGS. 2A and 2B) of the cover unit 12. A connection unit 11 such as a connector unit 14 (indicated with a cap on in FIGS. 1 through 3) described later with reference to the second embodiment, a power supply unit, etc. are provided on the front surface of the body unit 11 illustrated in FIG. 2B etc.

On the surface of the body unit 11 and the bottom of the cover unit 12, coupling projection units 11*c* and 12*b* projecting outside are provided opposite each other at plural positions (10 positions in the figure). Through holes 11*d* (FIGS. 4) and 12*c* are formed in the height direction at the coupling projection unit 11*c* of the body unit 11 and the coupling projection unit 12*b* of the cover unit 12.

The through holes 11*d* and 12*c* just face each other with the coupling projection unit 11*c* of the body unit 11 facing the coupling projection unit 12*b* of the cover unit 12. The body unit 11 and the cover unit 12 are coupled with each other by arranging a coupling member such as a bolt etc. not illustrated in the figure but passing through the through holes 11*d* and 12*c*.

For example, a packing 13 is enclosed in a concave portion 12*d* for packing formed on the contact surface between the body unit 11 and the cover unit 12, that is, on the bottom of the cover unit 12 in the present embodiment, and capable of accommodating the packing 13 as illustrated in FIG. 5. The packing 13 is an example of a sealing member which is, for example, elastic and realizes the seal of the inner space S of the shield case 10 illustrated in FIG. 1 by contact with the body unit 11 and the cover unit 12. The packing 13 can be used regardless of its shape, for example, in any shape of an O ring, a plate packing, a hollow packing, a rectangular section, etc.

The concave portion 12*d* for packing is provided all over the periphery of the rectangular-frame-shaped bottom of the cover unit 12 as the contact surface between the cover unit 12 and the body unit 11. Since the packing 13 is just enclosed in the concave portion 12*d* for packing, it is arranged all over the periphery of the rectangular-frame-shaped bottom as the contact surface of the cover unit 12 between the cover unit 12 and the body unit 11 as with the concave portion 12*d* for packing. The packing 13 can also be arranged on the body unit 11.

On the body unit 11, a paint film portion 11*e* as the painting of several ten μm is formed on the bottom and four sides as outer surfaces, and on the lower portion of the packing 13 and an area of the shield case 10 external to the concave portion 12*d* for packing among the upper surfaces as the opposing surfaces with the cover unit 12.

On the cover unit 12, a paint film portion 12*e* similar to the paint film portion 11*e* is formed on the top surface and four sides as outer surfaces, and on the upper portion of the packing 13 (bottom of the concave portion 12*d* for packing) and the area of the shield case 10 external to the concave portion 12*d* for packing among the bottoms as the opposing surfaces with the body unit 11. Thus, the paint film portions 11*e* and 12*e* are formed on the surfaces between the body unit 11 and the cover unit 12 and on the area of the shield case 10 external to the concave portion 12*d* for packing.

Without the interruption with the surface contact between the body unit 11 and the cover unit 12 on a convex portion 11*f* described later, the thicknesses of the paint film portions 11*e* and 12*e* are not specifically restricted, and a part of the paint film portions 11*e* and 12*e* can be formed on the area internal to the packing 13.

On the body unit 11, a convex portion 11*f* projecting toward the cover unit 12 is formed on the area of the shield case 10 on the inner space side and internal to the concave portion 12*d* for packing in the upper surface as the opposing surface with the cover unit 12. The convex portion 11*f* is also a non-paint-film portion on which no paint film portion 11*e* is formed.

On the cover unit 12, a non-paint-film portion 12*f* on which no paint film portion 12*e* is formed is positioned on the area of the shield case 10 on the inner space side and internal to the concave portion 12*d* for packing in the bottom as the opposing surface with the body unit 11. The surfaces of the body unit 11 and the cover unit 12 contact each other between the convex portion 11*f* and the non-paint-film portion 12*f*.

The convex portion 11*f* is formed with space with respect to the packing 13 along the packing 13 all over the inner periphery of the packing 13. The surfaces of the body unit 11 and the cover unit 12 contact each other all over the convex portion 11*f*, that is, all over the inner periphery of the packing 13.

The convex portion 11*f* can be formed not as the total inner periphery of the packing 13, but as a plurality of convex portions 11*f* provided at intervals along the packing 13. However, to enhance the electromagnetic shielding level, it is desired to form it all over the periphery of the packing 13.

The thickness t3 of the convex portion 11*f* with the body unit 11 coupled with the cover unit 12 is equal to or higher than the thickness (t1+t2) obtained by adding the thickness t1 of the paint film portion 11*e* of the body unit 11 to the thickness t2 of the paint film portion 12e of the cover unit 12 (t3≥t1+t2). Therefore, the contact of the surfaces of the body unit 11 and the cover unit 12 can be prevented from being interrupted by the paint film portions 11e and 12e without fail.

Assume that the thickness t3 of the convex portion 11f is equal to the sum (t1+t2) of the thickness t1 of the paint film portion 11e of the body unit 11 and the thickness t2 of the paint film portion 12e of the cover unit 12 (t3=t1+t2). In this case, according to the present embodiment, there is the contact of the surfaces at the paint film portions 11e and 12e in addition to the contact at the convex portion 11f between the body unit 11 and the cover unit 1.

However, if the paint film portions 11e and 12e are compressed by coupling, the surfaces of the body unit 11 and the cover unit 12 contact each other at the convex portion 11f and the paint film portions 11e and 12e although the thickness t3 is smaller than the thickness (t1+t2) of the paint film portions 11e and 12e before coupling.

Assume that the thickness t3 of the convex portion 11f is larger the sum (t1+t2) of the thickness t1 of the paint film portion 11e of the body unit 11 and the thickness t2 of the paint film portion 12e of the cover unit 12 (t3>t1+t2). In this case, according to the present embodiment, there arises a gap between the paint film portion 11e of the body unit 11 and the paint film portion 12e of the cover unit 12.

Although the gap arises, there is no problem if the packing 13 can guarantee the airtightness and the watertightness. Therefore, it is preferable that the thickness t3 of the convex portion 11f can allow the packing 13 to contact the body unit 11 and the cover unit 12, and more preferable that it is equal to or lower than the allowance that guarantees the target airtightness and watertightness of the packing 13.

The convex portion 11f can be formed not on the body unit 11, but on the cover unit 12 only, or can be formed on both body unit 11 and cover unit 12. In addition, an electroconductive member made of metal etc. independent of the body unit 11 and the cover unit 12 can be interposed as a convex portion between the body unit 11 and the cover unit 12.

A concave portion accommodating at least the paint film portions 11e and 12e can be provided for at least one of the opposite surfaces of the body unit 11 and the cover unit 12 to generate relative convex portions of the contact surfaces of the body unit 11 and the cover unit 12.

In the above-mentioned present embodiment, on each of the body unit 11 and the cover unit 12, the paint film portions 11e and 12e are formed on the area of the shield case 10 external to the concave portion 12d for packing. On the body unit 11 (the body unit 11 or the cover unit 12 or combination thereof), the convex portion 11f is formed on the area of the shield case 10 on the inner space side internal to the concave portion 12d for packing. Then, the surfaces of the body unit 11 and the cover unit 12 contact each other at the convex portion 11f.

Therefore, the convex portion 11f can prevent the contact of the surfaces of the body unit 11 and the cover unit 12 from being interrupted by the paint film portions 11e and 12e. Accordingly, the surface contact can enhance the electromagnetic shielding level. In addition, the paint film portions 11e and 12e can guarantee the durability, and the packing 13 can guarantee the airtightness and the watertightness.

Therefore, according to the present embodiment, the electromagnetic interference waves can be interrupted, and the durability, the airtightness, and the watertightness can be guaranteed.

In addition, according to the present embodiment, the convex portion 11f can be a member independent of the body unit 11 and the cover unit 12, but it is not always necessary to add a member, and a ready-made product can also be adopted by considering the influence on the size of the shield case 10.

In the present embodiment, the convex portion 11f is formed to have the thickness (t3 (≥t1+t2)) equal to or larger than the sum (t1+t2) obtained by adding the thickness t1 of the paint film portion 11e of the body unit 11 and the thickness t2 of the paint film portion 12e of the cover unit 12. Therefore, the convex portion 11f can prevent without fail the surface contact between the body unit 11 and the cover unit 12 from being interrupted by the paint film portions 11e and 12e. As a result, the electromagnetic interference waves can be interrupted without fail.

In addition, according to the present embodiment, the convex portion 11f is formed to have the thickness (t3 (≥t1+t2)) equal to or larger than the sum (t1+t2) obtained by adding the thickness t1 of the paint film portion 11e of the body unit 11 and the thickness t2 of the paint film portion 12e of the cover unit 12. Furthermore, the convex portion 11f is formed to have the thickness to contact the body unit 11 and the cover unit 12. Therefore, the electromagnetic interference wave can be interrupted without fail while guaranteeing the airtightness and the watertightness by the packing 13.

In the present embodiment, the convex portion 11f is formed along the packing 13 at the inner periphery of the packing 13. Furthermore, the convex portion 11f is formed along the packing 13 all over the inner periphery of the packing 13. Therefore, the electromagnetic shielding level can be enhanced, thereby interrupting the electromagnetic interference waves without fail.

In addition, according to the present embodiment, the body unit 11 of the shield case 10 is used as an example of the first shield member, and the cover unit 12 of the shield case 10 is used as an example of the second shield member. Therefore, the electromagnetic interference wave emitted by an electronic circuit etc. in the shield case 10 can be interrupted without fail.

<Second Embodiment>

Figure 6:
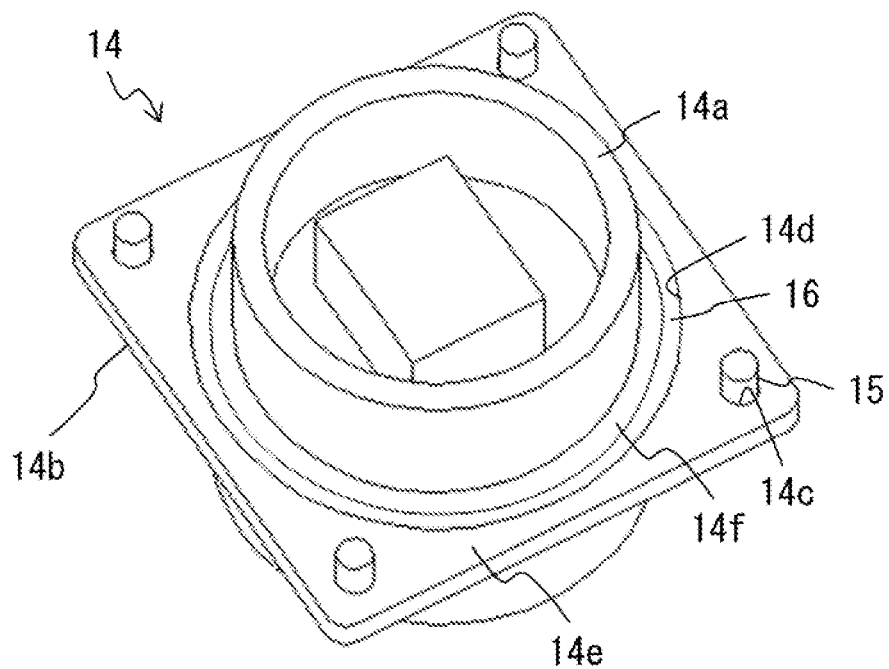
FIG. 6 is a perspective view of the connector unit of the shield case.

FIG. 6 is a perspective view of the connector unit 14 of the shield case 10.

Figure 7:
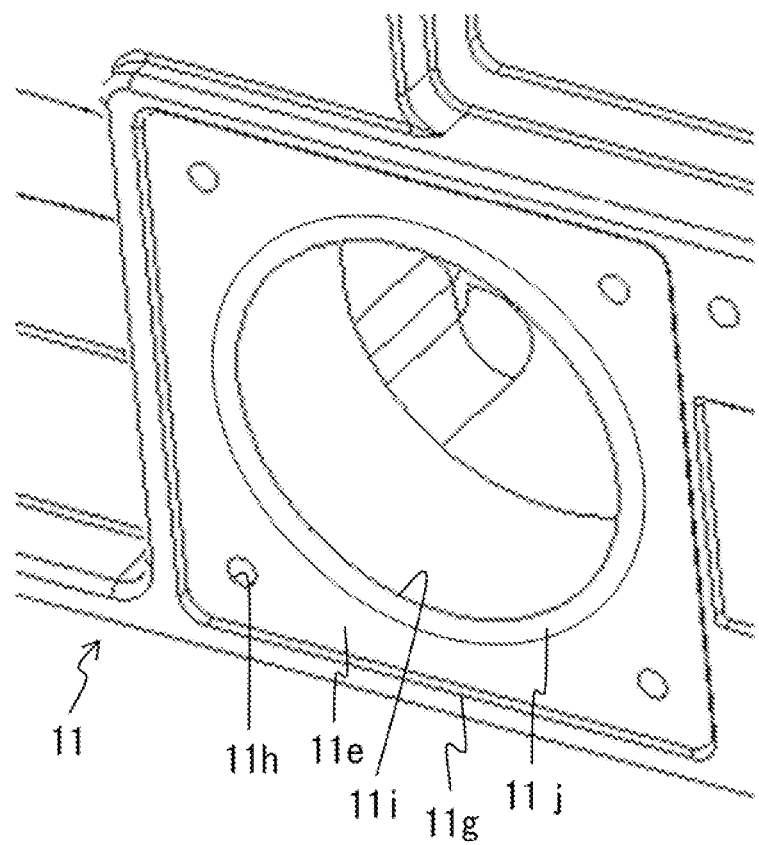
FIG. 7 is a perspective view of the connector attachment unit of the body unit of the shield case.

FIG. 7 is a perspective view of the connector attachment unit 11g of the body unit 11 of the shield case 10.

FIG. 8 is a sectional view of the convex portion 14f etc. of the shield case 10.

Since the shield case according to the present embodiment can include the same structure as the shield case 10 according to the first embodiment illustrated in FIGS. 1 through 4, the shield case 10 according to the present embodiment is described with the descriptions of the same components omitted here.

The shield case 10 includes the body unit 11, the cover unit 12 and the connector unit illustrated in FIG. 1 etc., and the connector unit 14 vertical at the right side (refer to FIG. 2B) of the body unit 11 as illustrated in FIG. 6. The body unit 11 and the connector unit 14 coupled to the body unit 11 to form the shield case 10 are electroconductive shield members (first shield member and second shield member) of metal etc. The cover unit 12 is also an electroconductive shield member of metal etc.

The connector unit 14 illustrated in FIG. 6 is attached to a connector attachment unit 11g of the body unit 11 illustrated in FIG. 7. The connector unit 14 includes a cylindrical unit 14a into which cable etc. is inserted, and a flange unit 14b extended toward the outer periphery of the cylindrical unit 14a. The flange unit 14b is formed in rectangular shape as viewed from the direction of the attachment of the connector unit 14. At the four corners of the flange unit 14b, through holes 14c through which bolts 15 pass as coupling units are formed in the direction of the attachment.

At the connector unit 14, it is desired that a shield member covers the cylindrical unit 14a so that cable can pass through the cylindrical unit 14a, thereby enhancing the electromagnetic shielding level of the cylindrical unit 14a.

The connector attachment unit 11g includes four attachment holes 11h as just facing the four through holes 14c of the flange unit 14b. The connector attachment unit 11g includes a through hole 11i into which a part of the cylindrical unit 14a of the connector unit 14 is inserted.

At the contact surfaces between the body unit 11 (connector attachment unit 11g) and the connector unit 14, that is, a concave portion 14d for packing formed in the flange unit 14b as illustrated in FIG. 8 according to the present embodiment, a packing 16 is enclosed, for example. The packing 16 is an example of a sealing member which is, for example, elastic and realizes the seal of the inner space S of the shield case 10 illustrated in FIG. 1 by contact with the body unit 11 and the flange unit 14b. The packing 16 can be used regardless of its shape, for example, in any shape of an O ring, a plate packing, a hollow packing, a rectangular section, etc.

The concave portion 14d for packing capable of accommodating the packing 16 is provided circularly on the contact surface of the flange unit 14b with the body unit 11. Since the packing 16 is enclosed by the concave portion 14d for packing, it is circularly arranged all over the contact surface of the flange unit 14b with the connector attachment unit 11g as with the concave portion 14d for packing. The packing 16 can also be arranged on the connector attachment unit 11g.

A paint film portion 14e as painting of, for example, several ten μm is formed on the bottom of the concave portion 14d for packing of the connector unit 14 and on the area of the shield case 10 external to the concave portion 14d for packing.

A convex portion 14f projecting toward the connector attachment unit 11g is formed in the connector unit 14 on the area of the shield case 10 on the inner space side and internal to the concave portion 14d for packing in the flange unit 14b facing the connector attachment unit 11g. The convex portion 14f is also a non-paint-film portion on which the paint film portion 14e is not formed.

At the side of the body unit 11, the paint film portion 11e is formed as described above with reference to the first embodiment, and a circular non-paint-film portion 11j on which no paint film portion 11e is formed is provided around the through hole 11i of the connector attachment unit 11g. The surfaces of the connector unit 14 and the connector attachment unit 11g contact each other at the convex portion 14f and the non-paint-film portion 11j.

A part of the paint film portions 11e and 14e can be formed on the internal to the packing 16 if the paint film portions 11e and 14e do not interrupt the contact of the surfaces between the body unit 11 and the connector unit 14 at the convex portion 14f. The thicknesses of the paint film portions 11e and 14e are not specifically restricted.

The convex portion 14f is formed along the packing 16 all over the inner periphery of the packing 16. The surfaces of the body unit 11 and the connector unit 14 contact each other all over the convex portion 14f, that is, all over the inner periphery of the packing 16.

The convex portion 14f can be formed not as the total inner periphery of the packing 16, but as a plurality of convex portions 14f provided at intervals along the packing 16. However, to enhance the electromagnetic shielding level, it is desired to form it all over the periphery of the packing 16.

The thickness t5 of the convex portion 14f with the body unit 11 coupled with the connector unit 14 is equal to or higher than the thickness (t1+t4) obtained by adding the thickness t1 of the paint film portion 11e of the connector attachment unit 11g to the thickness t4 of the paint film portion 14e of connector unit 14 (t5≥t1+t4). Therefore, the contact of the surfaces of the body unit 11 and the connector attachment unit 11g can be prevented from being interrupted by the paint film portions 11e and 14e without fail.

Assume that the thickness t3 of the convex portion 14f is equal to the sum (t1+t4) of the thickness t1 of the paint film portion 11e of the body unit 11 and the thickness t4 of the paint film portion 14e of the connector unit 14 (t5=t1+t4). In this case, there is the contact of the surfaces at the paint film portions 11e and 14e in addition to the contact at the convex portion 14f between the connector unit 14 and the connector attachment unit 11g.

However, if the paint film portions 11e and 14e are compressed by coupling, the surfaces of the body unit 11 and the connector unit 14 contact each other at the convex portion 14f and the paint film portions 11e and 14e although the thickness t5 is smaller than the thickness (t1+t4) of the paint film portions 11e and 14e before coupling.

Assume that the thickness t5 of the convex portion 14f is larger the sum (t1+t4) of the thickness t1 of the paint film portion 11e of the connector attachment unit 11g and the thickness t4 of the paint film portion 14e of the connector unit 14 (t5>t1+t4). In this case, there arises a gap between the paint film portion 11e of the connector attachment unit 11g and the paint film portion 14e of the connector unit 14.

Although the gap arises, there is no problem if the packing 16 can guarantee the airtightness and the watertightness. Therefore, it is preferable that the thickness t5 of the convex portion 14f can allow the packing 16 to contact the connector attachment unit 11g and the flange unit 14b of the connector unit 14, and more preferable that it is equal to or lower than the allowance that guarantees the target airtightness and watertightness of the packing 13.

The convex portion 14f can be formed not on the connector unit 14, but on the connector attachment unit 11g only, or can be formed on both connector unit 14 and connector attachment unit 11g. In addition, an electroconductive member made of metal etc. independent of the connector unit 14 and the connector attachment unit 11g can be interposed as a convex portion between the connector unit 14 and the connector attachment unit 11g.

A concave portion accommodating at least the paint film portions 11e and 14e can be provided for the flange unit 14b or the connector attachment unit 11g or combination thereof to generate relative convex portions of the contact surfaces of the flange unit 14b and the connector attachment unit 11g.

In the above-mentioned present embodiment, on the body unit 11 and the connector unit 14, the paint film portions 11e and 14e are formed on the area of the shield case 10 external to the concave portion 14d for packing. On the body unit 11 (the body unit 11 or the connector unit 14 or combination thereof), the convex portion 11f is formed on the area of the shield case 10 on the inner space side internal to the concave portion 14d for packing. Then, the surfaces of the body unit 11 and the connector unit 14 contact each other at the convex portion 14f.

Therefore, the convex portion 14f can prevent the contact of the surfaces of the body unit 11 and the connector unit 14 from being interrupted by the paint film portions 11e and 14e. Accordingly, the surface contact can enhance the electromagnetic shielding level. In addition, the paint film portions 11e and 14e can guarantee the durability, and the packing 16 can guarantee the airtightness and the watertightness.

Therefore, according to the present embodiment, the electromagnetic interference waves can be interrupted, and the durability, the airtightness, and the watertightness can be guaranteed.

In addition, according to the present embodiment, the convex portion 14f can be a member independent of the body unit 11 and the connector unit 14, but it is not always necessary to add a member, and a ready-made product can also be adopted by considering the influence on the size of the shield case 10.

In the present embodiment, the convex portion 14f is formed to have the thickness (t5 (≥1+t4)) equal to or larger than the sum (t1+t4) obtained by adding the thickness t1 of the paint film portion 11e of the body unit 11 and the thickness t4 of the paint film portion 14e of the connector unit 14. Therefore, the convex portion 14f can prevent without fail the surface contact between the body unit 11 and the connector unit 14 from being interrupted by the paint film portions 11e and 14e. As a result, the electromagnetic interference waves can be interrupted without fail.

In addition, according to the present embodiment, the convex portion 14f is formed to have the thickness (t5 (≥1+t4)) equal to or larger than the sum (t1+t4) obtained by adding the thickness t1 of the paint film portion 11e of the connector unit 14 and the thickness t4 of the paint film portion 14e of the connector unit 14. Furthermore, the convex portion 14f is formed to have the thickness to contact the body unit 11 and the connector unit 14. Therefore, the electromagnetic interference wave can be interrupted without fail while guaranteeing the airtightness and the watertightness by the packing 16.

In the present embodiment, the convex portion 14f is formed along the packing 16 at the inner periphery of the packing 16. Furthermore, the convex portion 14f is formed along the packing 16 all over the inner periphery of the packing 16. Therefore, the electromagnetic shielding level can be enhanced, thereby interrupting the electromagnetic interference waves without fail.

According to the present embodiment, the connector unit 14 is used as an example of the second shield member. The connector unit 14 includes the flange unit 14b, and the packing 16 is arranged on the contact surfaces between the first shield member (body unit 11) and the flange unit 14b. The convex portion 14f is formed on the area of the shield case on the inner space side and internal to the concave portion 14d for packing. Therefore, the electromagnetic interference wave emitted from the electronic circuit etc. in the shield case 10 can be interrupted between the connector unit 14 and the first shield member (body unit 11).

In the first and second embodiments described above, the body unit 11, the cover unit 12, and the connector unit 14 are described as the first and second shield members. However, as a shield member, any electroconductive substance of metal etc. such as a small window unit etc. that can be opened and closed and provided in the cover unit 12 can be used.

All examples and conditional language recited herein are intended for pedagogical purposes to aid the reader in understanding the invention and the concepts contribute by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A shield case, comprising:
a first shield member; and
a second shield member coupled to the first shield member to form the shield case, wherein:
a concave portion capable of accommodating a sealing member for sealing inner space of the shield case by contacting the first shield member and the second shield member is formed on the second shield member;
on each of the first shield member and the second shield member, a paint film portion is formed on an area of the shield case external to the concave portion;
on the first shield member or the second shield member or combination thereof, a convex portion is formed on an area that is closer to the inner space of the shield case than the concave portion; and
surfaces of the first shield member and the second shield member contact each other at the convex portion.

2. The shield case according to claim 1, wherein
the convex portion is formed to include a thickness equal to or larger than a thickness obtained by adding a thickness of the paint film portion of the first shield member and a thickness of the paint film portion of the second shield member.

3. The shield case according to claim 2, wherein
the convex portion is formed to have a thickness equal to or larger than a thickness obtained by adding a thickness of the paint film portion of the first shield member and a thickness of the paint film portion of the second shield member, and formed to have the thickness that allows the sealing member to contact the first shield member and the second shield member.

4. The shield case according to claim 1, wherein
the convex portion is formed along the sealing member on the inner periphery of the sealing member.

5. The shield case according to claim 4, wherein
the convex portion is formed along the sealing member all over the inner periphery of the sealing member.

6. The shield case according to claim 1, wherein:
one of the first shield member and the second shield member is a body unit of the shield case;
another of the first shield member and the second shield member is a cover unit of the shield case.

7. The shield case according to claim 1, wherein
one of the first shield member and the second shield member is a connector unit.

8. The shield case according to claim 7, wherein:
the connector unit includes a flange unit; and
the sealing member is arranged at a contact surface between the flange unit and the other of the first shield member and the second member that is coupled to the connector unit.

9. A communication device, comprising:
a first shield member:
a second shield member coupled to the first shield member to form a shield case; and
a substrate provided with an electronic circuit and arranged in a inner space of the shield case, wherein:
a concave portion capable of accommodating a sealing member for sealing inner space of the shield case by contacting the first shield member and the second shield member is formed on the second shield member;
on each of the first shield member and the second shield member, a paint film portion is formed on an area of the shield case external to the concave portion;
on the first shield member or the second shield member or combination thereof, a convex portion is formed on an area that is closer to the inner space of the shield case than the concave portion; and surfaces of the first shield member and the second shield member contact each other at the convex portion.

10. The communication device according to claim 9, wherein the convex portion is formed to have a thickness equal to or larger than a thickness obtained by adding a thickness of the paint film portion of the first shield member and a thickness of the paint film portion of the second shield member.

11. The communication device according to claim 10, wherein the convex portion is formed to have a thickness equal to or larger than a thickness obtained by adding a thickness of the paint film portion of the first shield member and a thickness of the paint film portion of the second shield member, and formed to have the thickness that allows the sealing member to contact the first shield member and the second shield member.

12. The communication device according to claim 9, wherein the convex portion is formed along the sealing member on the inner periphery of the sealing member.

13. The communication device according to claim 12, wherein the convex portion is formed along the sealing member all over the inner periphery of the sealing member.

14. The communication device according to claim 9, wherein:

one of the first shield member and the second shield member is a body unit of the shield case;

another of the first shield member and the second shield member is a cover unit of the shield case.

15. The communication device according to claim 9, wherein one of the first shield member and the second shield member is a connector unit.

16. The communication device according to claim 15, wherein:

the connector unit includes a flange unit; and the sealing member is arranged at a contact surface between the flange unit and the other of the first shield member and the second member that is coupled to the connector unit.

* * * * *